(12) United States Patent
Chhun et al.

(10) Patent No.: US 9,876,032 B2
(45) Date of Patent: Jan. 23, 2018

(54) METHOD OF MANUFACTURING A DEVICE WITH MOS TRANSISTORS

(71) Applicants: STMicroelectronics (Crolles 2) SAS, Crolles (FR); Commissariat A L'Energie Atomique et aux Energies Alternatives, Paris (FR)

(72) Inventors: Sonarith Chhun, Pontcharra (FR); Emmanuel Josse, La Motte Servolex (FR); Gregory Bidal, Grenoble (FR); Dominique Golanski, Gieres (FR); Francois Andrieu, Saint-Ismier (FR); Jerome Mazurier, Cestas (FR); Olivier Weber, Grenoble (FR)

(73) Assignees: STMicroelectronics (Crolles 2) SAS, Crolles (FR); Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/296,205

(22) Filed: Oct. 18, 2016

(65) Prior Publication Data

US 2017/0117296 A1 Apr. 27, 2017

(30) Foreign Application Priority Data

Oct. 22, 2015 (FR) ..................................... 15 60090

(51) Int. Cl.
*H01L 21/336* (2006.01)
*H01L 27/092* (2006.01)
(Continued)

(52) U.S. Cl.
CPC ...... *H01L 27/1203* (2013.01); *H01L 21/0217* (2013.01); *H01L 21/02164* (2013.01);
(Continued)

(58) Field of Classification Search
CPC ......... H01L 21/823864; H01L 27/0922; H01L 29/6653
See application file for complete search history.

(56) References Cited

U.S. PATENT DOCUMENTS

| 9,105,742 B1 | 8/2015 | Basker et al. |
| 2006/0151840 A1 | 7/2006 | Maekawa |

(Continued)

OTHER PUBLICATIONS

INPI Search Report and Written Opinion for FR 1560090 dated Aug. 25, 2016 (10 pages).

*Primary Examiner* — Daniel Shook
(74) *Attorney, Agent, or Firm* — Gardere Wynne Sewell LLP

(57) ABSTRACT

A device includes both low-voltage (LV) and high-voltage (HV) metal oxide semiconductor (MOS) transistors of opposite types. Gate stacks for the transistors are formed over a semiconductor layer. First spacers made of a first insulator are provided on the gate stacks of the LV and HV MOS transistors. Second spacers made of a second insulator are provided on the gate stacks of the HV MOS transistors only. The insulators are selectively removed to expose the semiconductor layer. Epitaxial growth of semiconductor material is made from the exposed semiconductor layer to form raised source-drain structures that are separated from the gate stacks by the first spacers for the LV MOS transistors and the second spacers for the HV MOS transistors.

18 Claims, 4 Drawing Sheets

(51) Int. Cl.

| | |
|---|---|
| *H01L 27/12* | (2006.01) |
| *H01L 21/8238* | (2006.01) |
| *H01L 29/66* | (2006.01) |
| *H01L 21/306* | (2006.01) |
| *H01L 21/84* | (2006.01) |
| *H01L 21/02* | (2006.01) |
| *H01L 29/08* | (2006.01) |
| *H01L 29/417* | (2006.01) |
| *H01L 21/8234* | (2006.01) |
| *H01L 29/16* | (2006.01) |
| *H01L 29/161* | (2006.01) |

(52) U.S. Cl.
CPC .. *H01L 21/02529* (2013.01); *H01L 21/02532* (2013.01); *H01L 21/30608* (2013.01); *H01L 21/823418* (2013.01); *H01L 21/823437* (2013.01); *H01L 21/823468* (2013.01); *H01L 21/823814* (2013.01); *H01L 21/823828* (2013.01); *H01L 21/823864* (2013.01); *H01L 21/84* (2013.01); *H01L 27/0922* (2013.01); *H01L 29/0847* (2013.01); *H01L 29/41783* (2013.01); *H01L 29/6653* (2013.01); *H01L 29/16* (2013.01); *H01L 29/161* (2013.01); *H01L 29/1608* (2013.01)

(56) References Cited

U.S. PATENT DOCUMENTS

| | | | |
|---|---|---|---|
| 2007/0275528 A1* | 11/2007 | Koike | H01L 21/82346 438/283 |
| 2012/0276695 A1* | 11/2012 | Cheng | H01L 27/1211 438/154 |
| 2014/0353756 A1* | 12/2014 | Yamamoto | H01L 27/1203 257/351 |
| 2015/0076608 A1 | 3/2015 | Cheng et al. | |
| 2015/0364490 A1* | 12/2015 | Oda | H01L 21/26513 257/351 |

\* cited by examiner

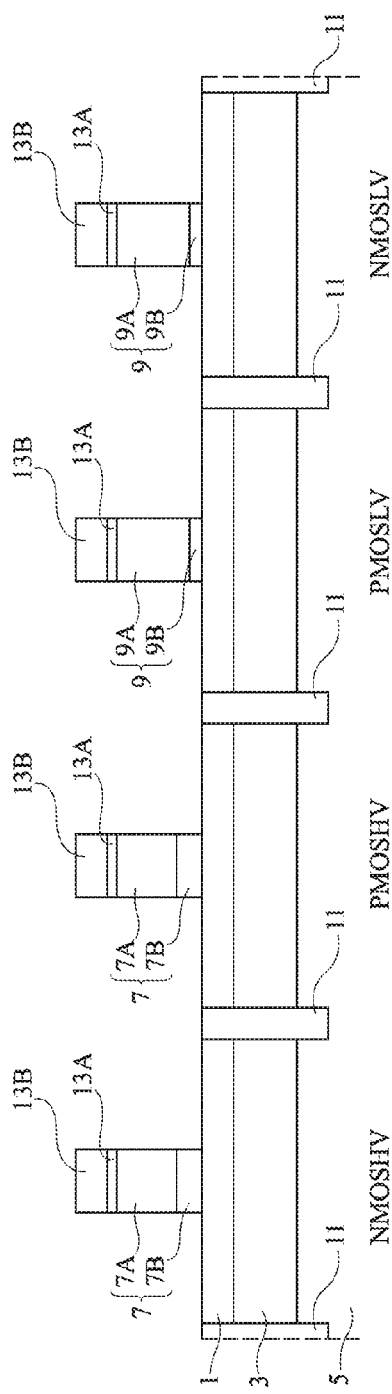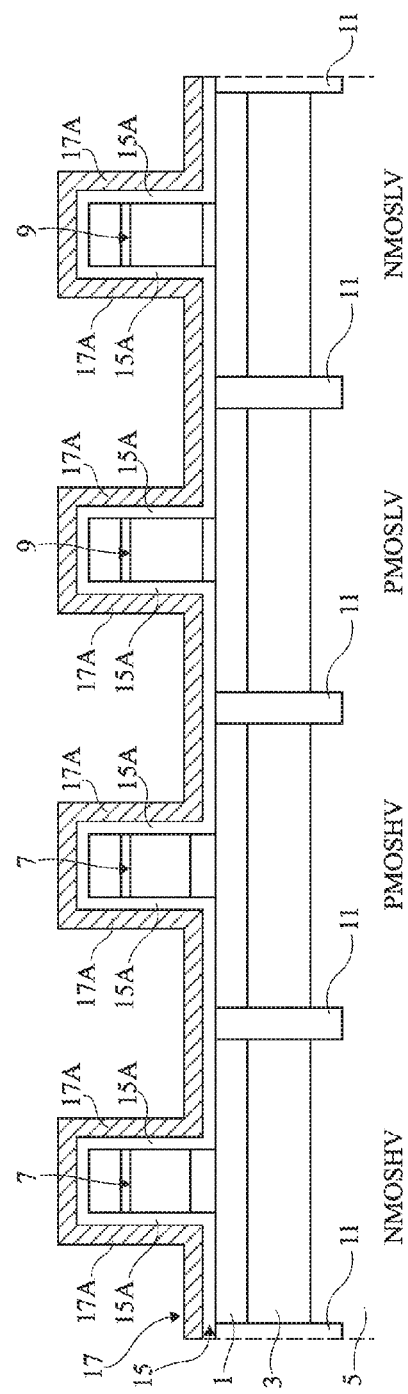

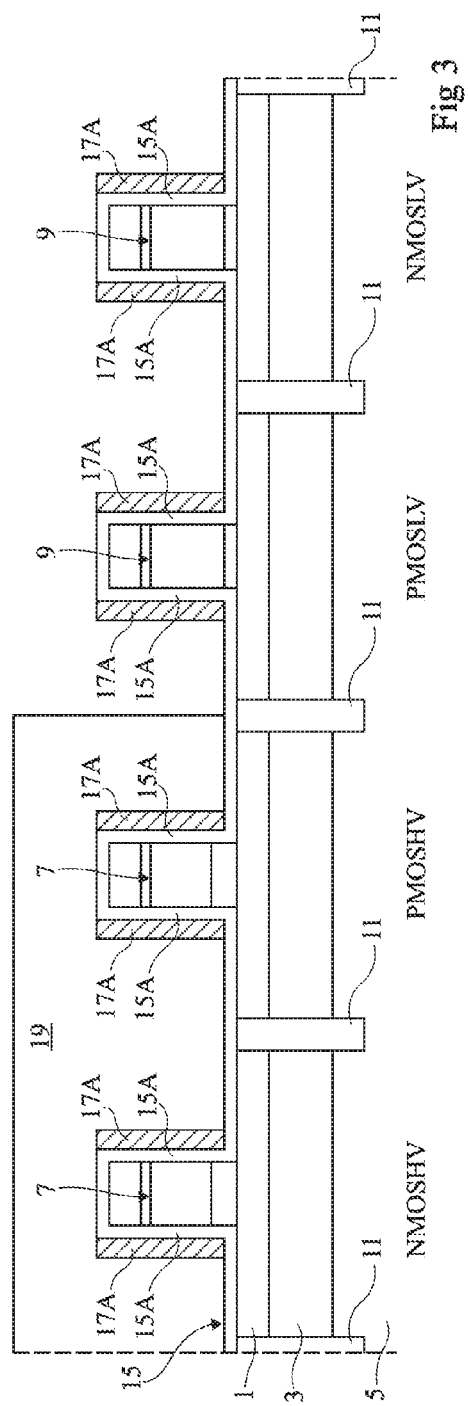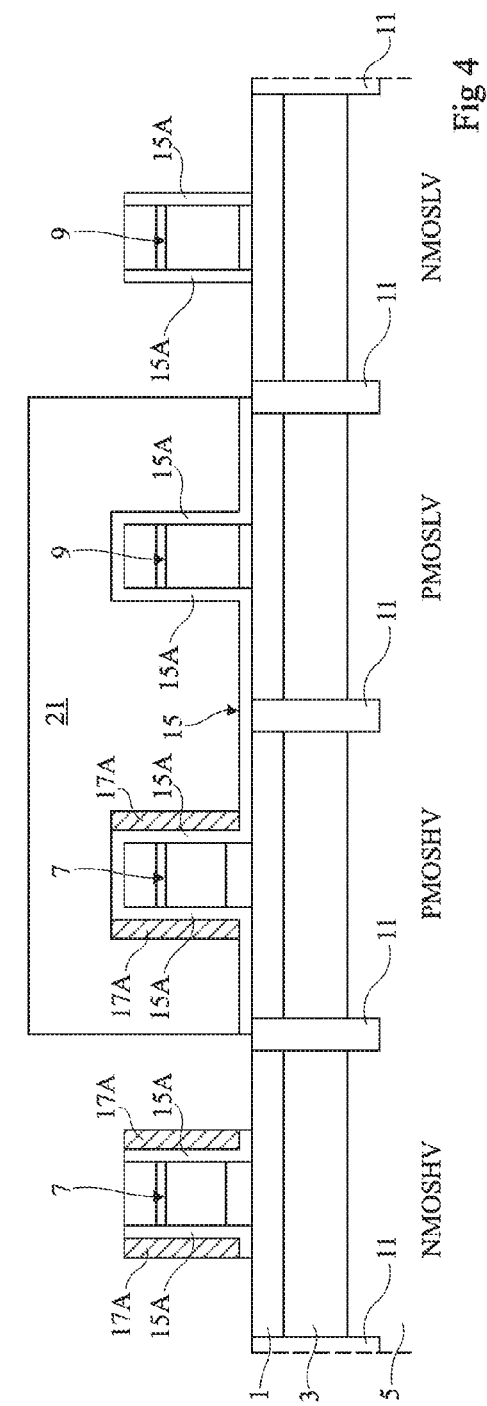

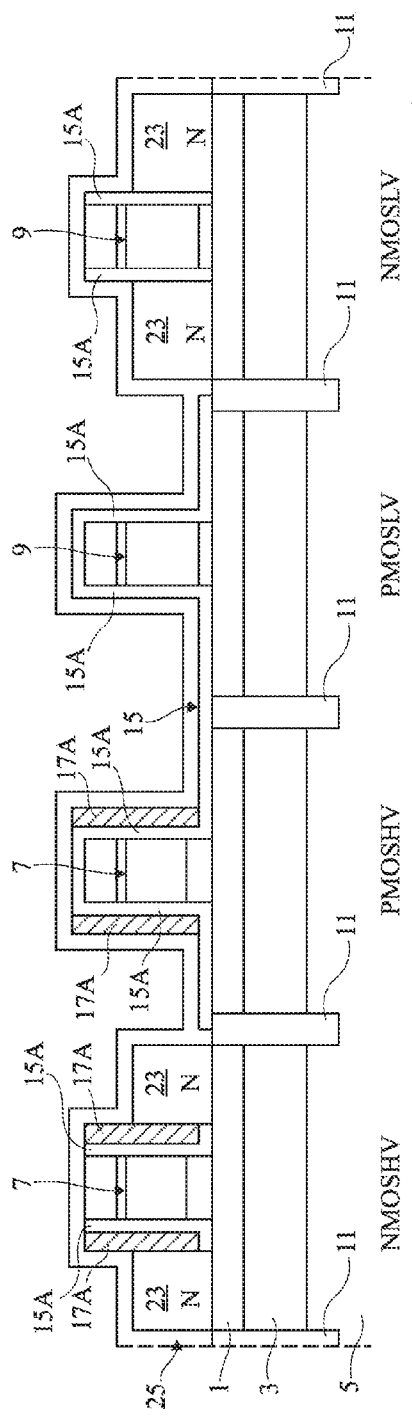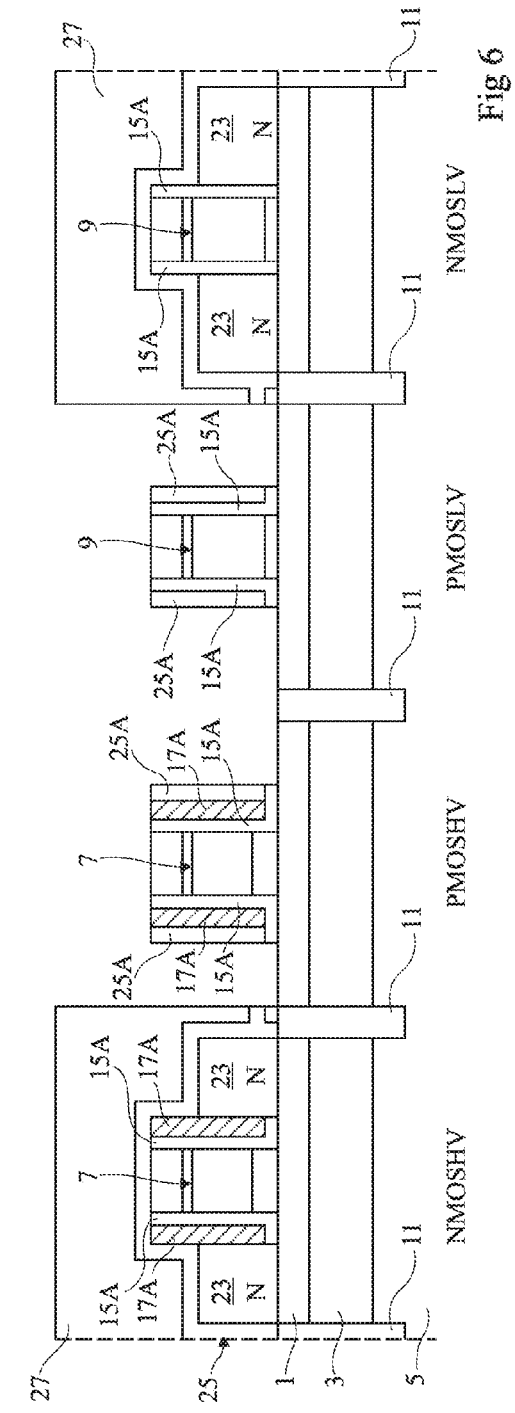

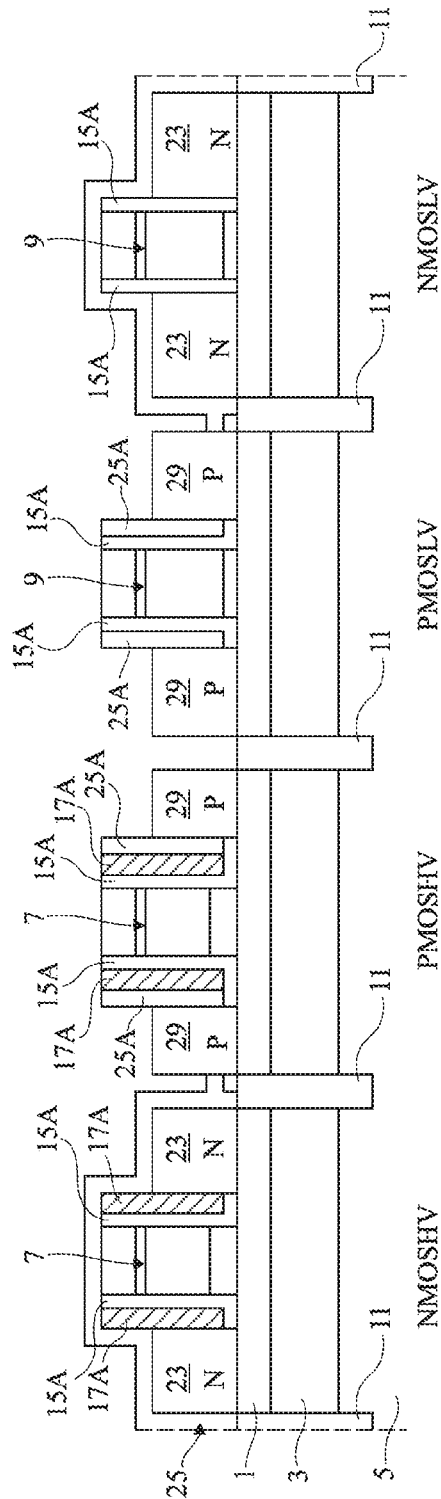
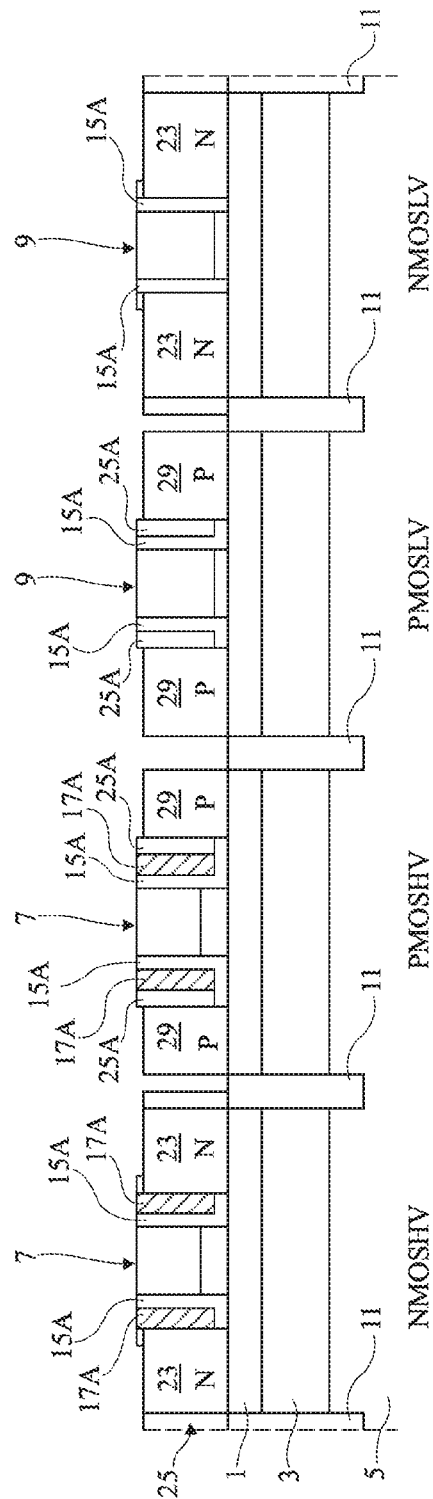

METHOD OF MANUFACTURING A DEVICE WITH MOS TRANSISTORS

PRIORITY CLAIM

This application claims the priority benefit of French Application for Patent No. 1560090, filed on Oct. 22, 2015, the disclosure of which is hereby incorporated by reference in its entirety to the maximum extent allowable by law.

TECHNICAL FIELD

The present disclosure relates to a method of manufacturing a device comprising metal oxide semiconductor (MOS) transistors having their source and drain regions thickened/raised by epitaxy from a semiconductor layer.

BACKGROUND

In a device comprising MOS transistors formed from a SOI ("semiconductor on insulator") semiconductor layer, when the semiconductor layer thickness (arranged on a buried layer of insulator) becomes low, currently below 20 nm, the source and drain regions of the transistors are generally thickened by epitaxy of a semiconductor material from the upper surface of the semiconductor layer. Such source and drain regions thickened by epitaxy, referred to in the art as raised source/drain structures, may also be provided in a device comprising MOS transistors formed from a semiconductor substrate, for example, to stress the channel-forming region of the transistors and thus improve their performance.

In a device comprising transistors with source and drain regions thickened by epitaxy, or epitaxial source and drain regions, the insulating spacers laterally bordering the gate stack of each transistor then separate the epitaxial source and drain regions from the conductive gate areas. A stray drain-source/gate capacitance having its value essentially defined by the material(s) of the spacers and by the width of the spacers thus exists. There also is a risk of breakdown of the spacer material, that risk being all the greater if the transistor is intended to operate at high voltages.

In the case where the device comprises transistors intended to operate at high voltages (HV transistors), the width of the spacers of the transistors of the device may be increased to decrease the risk of breakdown and the stray drain-source/gate capacitance of the transistors of the device. However, when the device also comprises transistors intended to operate at low voltages (LV transistors), this results in various disadvantages such as a degradation of the performance of LV transistors.

It would then be desirable to have a method of manufacturing a device comprising both HV and LV MOS transistors with epitaxial drain and source regions, where the spacers of the HV transistors are laterally wider than the spacers of the LV transistors of same type.

SUMMARY

Thus, an embodiment provides a method of manufacturing a device comprising LV low-voltage and HV high-voltage MOS transistors, of a first and of a second type, the method comprising the successive steps of: a) providing a semiconductor layer; b) forming gate stacks of LV and HV MOS transistors; c) forming first spacers by depositing a first layer of a first insulating material; d) forming second spacers of a second insulating material different from the first insulating material; e) removing the second spacers from the LV transistors; f) at the location of each transistor of the first type, etching the first layer all the way to the semiconductor layer by leaving in place all the spacers; g) growing a first doped semiconductor material of the first conductivity type from the exposed surface of the semiconductor layer; h) depositing a second layer of the first insulating material; i) at the location of each transistor of the second type, etching the first and second layers all the way to the semiconductor layer while leaving in place all the spacers; and j) growing a second doped semiconductor material of the second conductivity type from the exposed surface of the semiconductor layer.

According to an embodiment, step d) comprises depositing a layer of the second material, and removing by etching the layer of the second material while leaving in place the second spacers.

According to an embodiment, the gate insulator of the gate stack of the LV transistors has an equivalent thickness smaller than the equivalent thickness of the gate insulator of the gate stack of the HV transistors.

According to an embodiment, the semiconductor layer rests on an insulator and the thickness of the semiconductor layer is smaller than 20 nm.

According to an embodiment, the first insulating material is silicon nitride and the second insulating material is silicon oxide.

According to an embodiment, the transistors of the first type have an N channel and the transistors of the second type have a P channel.

According to an embodiment, each of the first and second semiconductor materials is selected from the group comprising silicon, germanium, silicon carbide, and silicon-germanium.

Another embodiment provides a device comprising low voltage, LV, and high voltage, HV, MOS transistors, of a first and of a second type, wherein: the gate stack of each transistor rests on a semiconductor layer; the source and drain regions of each transistor of the first type comprise a first doped semiconductor material of the first conductivity type laterally bordering the gate stack of the transistor; the source and drain regions of each transistor of the second type comprise a second doped semiconductor material of the second conductivity type laterally bordering the gate stack of the transistor; and each transistor comprises first spacers of a first insulating material, the HV transistors further comprising second spacers made of a second insulating material different from the first material.

According to an embodiment, the P-channel HV transistors comprise three successive elementary spacers: a first spacer made of a first insulating material, a second spacer made of a second insulating material different from the first insulating material, and a third spacer made of the first insulating material.

According to an embodiment, the first and third spacers join on the side of the semiconductor layer to form a U-shape.

According to an embodiment, the gate insulator of the gate stack of the LV transistors has an equivalent thickness smaller than the equivalent thickness of the gate insulator of the gate stack of the HV transistors.

According to an embodiment, the semiconductor layer rests on an insulator and the thickness of the semiconductor layer is smaller than 20 nm.

According to an embodiment, the first insulating material is silicon nitride and the second insulating material is silicon oxide.

According to an embodiment, the transistors of the first type have an N channel and the transistors of the second type have a P channel.

According to an embodiment, each of the first and second semiconductor materials is selected from the group comprising silicon, germanium, silicon carbide, and silicon-germanium.

BRIEF DESCRIPTION OF THE DRAWINGS

The foregoing and other features and advantages will be discussed in detail in the following non-limiting description of specific embodiments in connection with FIGS. 1 to 8, which are cross-section views schematically showing a structure at successive steps of an embodiment of a manufacturing method.

DETAILED DESCRIPTION

The same elements have been designated with the same reference numerals in the various drawings and, further, the various drawings are not to scale. In the following description, terms "upper", "lateral", and "top" refer to the orientation of the concerned elements in the corresponding drawings. Unless otherwise indicated, the term "approximately" means to within 10%, preferably to within 5%.

FIG. 1 is a cross-section view schematically showing an SOI-type structure at a step of a method of manufacturing a device comprising four types of MOS transistors:

high-voltage N-channel MOS transistors (NMOSHV),
high-voltage P-channel MOS transistors (PMOSHV),
low-voltage P-channel MOS transistors (PMOSLV), and
low-voltage N-channel MOS transistors (NMOSLV).

The structure comprises a semiconductor layer 1 resting on an insulating layer 3 arranged on a semiconductor substrate 5. A gate stack 7 has been formed at each NMOSHV and PMOSHV transistor location, and a gate stack 9 has been formed at each NMOSLV and PMOSLV transistor location. Gate stacks 7 comprise a conductive area 7A separated from semiconductor layer 1 by a gate insulator 7B. Gate stacks 9 comprise a conductive area 9A separated from semiconductor layer 1 by a gate insulator 9B having a thickness (or an equivalent thickness) smaller than that of gate insulator 7B. In this example, each transistor location is laterally delimited by an insulating wall 11 crossing semiconductor layer 1. As shown, a hard mask 13 may be arranged on the top of each gate stack 7 and 9, hard mask 13 for example comprising a silicon oxide layer 13A coated with a silicon nitride layer 13B.

As an example, the material of semiconductor layer 1 is selected from the group comprising silicon, germanium, silicon-germanium, and silicon carbide, and different semiconductor materials may be used for the different types of transistors to be formed. The thickness of the semiconductor layer may be smaller than 20 nm, for example, equal to 10 nm. Gate insulators 7B and 9B may be made of silicon oxide or of an insulating material of high dielectric constant ("high k").

At the step of FIG. 2, the structure has been coated with an insulating layer 15 and then with an insulating layer 17, the materials of layers 15 and 17 being selected to be selectively etchable over each other. The material of layer 15 particularly borders each gate stack 7 and 9 and forms spacers 15A therein. The material of layer 17 laterally borders spacers 15A and form spacers 17A therein.

As an example, layer 15 is made of silicon nitride having a thickness which may be in the range from 2.5 to 10 nm, for example, 5 nm, and layer 17 is made of silicon oxide having a thickness which may be in the range from 10 to 20 nm, for example, 15 nm.

At the step of FIG. 3, an anisotropic etching of layer 17, for example, a reactive ion etching, has been carried out to leave in place spacers 17A and layer 15. A resin layer 19 has then been deposited and etched to cover the structure at the location of each NMOSHV and PMOSHV transistor.

At the step of FIG. 4, the spacers 17A bordering gate stacks 9 of the NMOSLV and PMOSLV transistors have been removed. Resin 19 covering the NMOSHV and PMOSHV transistors has been removed and a resin layer 21 has been deposited and etched to cover the structure at the location of each PMOSLV and PMOSHV transistor. Insulating layer 15 has then been removed by anisotropic etching all the way to semiconductor layer 1, for example, by reactive ion etching, resin 21 being used as an etch mask. At the location of each NMOSHV and NMOSLV transistor, the upper surface of semiconductor layer 1 is exposed and spacers 15A and 17A are left in place.

At the step of FIG. 5, resin 21 has been removed. A semiconductor material 23, for example, silicon or silicon carbide, N-type doped in situ, has been made to grow by epitaxy from the exposed portions of the upper surface of semiconductor layer 1 at the locations of the NMOSLV and NMOSHV transistors. At these locations, semiconductor material 23 then borders gate stacks 7 and 9 provided with their spacers. An insulating layer 25 has then been deposited over the entire exposed surface of the structure. The material of layer 25 is the same as that of layer 15, for example, silicon nitride. The thickness of layer 25 may be in the range from 2 to 5 nm, for example, 3 nm.

At the step of FIG. 6, a resin layer 27 has been deposited and etched to cover the structure at the location of each NMOSHV and NMOSLV transistor. Insulating layers 15, 17, and 25 have then been removed by anisotropic etching all the way to the semiconductor layer, for example, by reactive ion etching, resin 27 being used as an etch mask. Thus, at the location of each PMOSHV and PMOSLV transistor, spacers 15A and 17A are left in place and the upper surface of semiconductor layer 1 is exposed. Further, as shown, portions 25A of layer 25 laterally bordering gate stacks 7 and 9 of the PMOSHV and PMOSLV transistors are left in place.

At the step of FIG. 7, resin 27 has been removed. A semiconductor material 29, for example, silicon or silicon-germanium, P-type doped in situ, has been made to grow by epitaxy from the exposed portions of the upper surface of semiconductor layer 1 at the locations of the PMOSHV and PMOSLV transistors. Thus, at these locations, material 29 laterally borders a gate stack 7 or 9.

At the step of FIG. 8, portions of layer 25 have been removed by anisotropic etching, for example, by reactive ion etching, to leave in place spacers 15A and 17A, and portions 25A. Hard mask 13 has then been removed by isotropic etching.

A device comprising four transistor types, that is, NMOSHV, NMOSLV, PMOSHV, and PMOSLV is thus obtained, the NMOSHV and PMOSHV transistors being for example intended to operate at voltages greater than 1.8 V, and the NMOSLV and PMOSLV transistors being for example intended to operate at voltages smaller than or equal to approximately 1 V. Each drain and source region of the NMOSLV and NMOSHV transistors is thickened by an epitaxial layer 23, and, similarly, each drain and source region of the PMOSLV and PMOSHV transistors 7 is thickened by an epitaxial layer 29. Gate stack 7 or 9 of each transistor is separated from material 23 or 29 by spacers 15A, gate stack 7 of each NMOSHV and PMOSHV transistor being further separated from material 23 or 29 by spacers 17A.

Due to the fact that the assembly of spacers 15A and 17A is wider than spacers 15A, the risk of breakdown of the NMOSHV and PMOSHV transistors is decreased with respect to the case where these transistors only comprise spacers 15A like the NMOSLV and PMOSLV transistors.

Due to the fact that spacers 15A of the NMOSLV, NMOSHV, PMOSLV, and PMOSHV transistors and spacers 17A of the NMOSHV and PMOSHV transistors are formed before the epitaxy steps, the epitaxy of semiconductor material 23 is performed simultaneously for all the NMOSLV and NMOSHV transistors, and the epitaxy of semiconductor material 29 is performed simultaneously for all PMOSLV and PMOSHV transistors.

At the epitaxy step described in relation with FIG. 5, at the location of each PMOSLV and PMOSHV transistor, layer 15 coats the upper surface of semiconductor layer 1 so that semiconductor material cannot grow therein. Thus, layer 15 is used as a mask during the epitaxy step in addition to being used to form spacers 15A.

Specific embodiments have been described. Various alterations and modifications will occur to those skilled in the art. In particular, those skilled in the art may adapt the previously-indicated materials. For example, semiconductor material 23 may be the same, with an opposite conductivity type, as material 29, and conversely. Further, the conductivity types of the previously-indicated layers, regions, and materials may all be inverted.

The order and the number of the steps of the above-described method may be modified by those skilled in the art. For example, the steps of preparation, or cleaning, of the upper surface of semiconductor layer 1 may be provided before each epitaxy step.

Further, although a method where semiconductor layer 1 is of SOI type has been described, this semiconductor layer may also correspond to a semiconductor substrate.

Although this has not been shown, it should be understood that during the steps of anisotropic etching of layer 17, of layer 15, and/or of layer 25, or during possible steps of preparing the upper surface of the semiconductor layer, the material of spacers 17A may be partially etched. Those skilled in the art will then choose to deposit the material of layer 17 with a sufficient thickness to obtain spacers 17A having a desired width, despite the above-mentioned partial etchings. For example, in the previously-described method, when a step of preparing the upper surface of semiconductor layer 1 with a solution comprising hydrofluoric acid is provided before each epitaxy, a silicon oxide layer 17 deposited with a 15-nm thickness may enable to obtain spacers 17A having a 6-nm width.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing a device comprising low-voltage (LV) and high-voltage (HV) metal oxide semiconductor (MOS) transistors, of a first type and of a second type, comprising the successive steps of:
    a) forming gate stacks of the LV and HV MOS transistors over a semiconductor layer;
    b) forming first spacers by depositing a first layer of a first insulating material;
    c) forming second spacers of a second insulating material different from the first insulating material;
    d) removing the second spacers from the LV MOS transistors;
    e) at the location of each transistor of the first type, etching the first layer all the way to the semiconductor layer while leaving in place only the first spacer on the gate stack of the LV MOS transistor of the first type and leaving in place both the first and second spacers on the gate stack of the HV MOS transistor of the first type;
    f) growing a first doped semiconductor material of a first conductivity type from an exposed surface of the semiconductor layer at the location of each transistor of the first type;
    g) depositing a second layer of the first insulating material on the gate stacks of the LV and HV MOS transistors of the second type;
    h) at the location of each transistor of the second type, etching the first and second layers all the way to the semiconductor layer while leaving in place the second layer and the first and second spacers on the gate stack of the HV MOS transistor of the second type and leaving in place the second layer and the first spacer on the gate stack of the HV MOS transistor of the second type; and
    i) growing a second doped semiconductor material of a second conductivity type from the exposed surface of the semiconductor layer at the location of each transistor of the second type.

2. The method of claim 1, wherein step c) comprises depositing a layer of the second material, and removing by etching the layer of the second material while leaving in place the second spacers.

3. The method of claim 1, wherein a gate insulator of the gate stack of the LV MOS transistors has an equivalent thickness smaller than an equivalent thickness of a gate insulator of the gate stack of the HV MOS transistors.

4. The method of claim 1, wherein the semiconductor layer rests on an insulator and a thickness of the semiconductor layer is smaller than 20 nm.

5. The method of claim 1, wherein the first insulating material is silicon nitride and the second insulating material is silicon oxide.

6. The method of claim 1, wherein the transistors of the first type are NMOS and the transistors of the second type are PMOS.

7. The method of claim 1, wherein each of the first and second semiconductor materials is selected from a group consisting of: silicon, germanium, silicon carbide, and silicon-germanium.

8. A device comprising low-voltage (LV) and high-voltage (HV) metal oxide semiconductor (MOS) transistors of a first type and of a second type, comprising:
    a gate stack of each transistor on a semiconductor layer;
    source and drain regions of each transistor of the first type comprising a first doped semiconductor material of a first conductivity type laterally bordering the gate stack of the transistor;
    source and drain regions of each transistor of the second type comprising a second doped semiconductor material of a second conductivity type laterally bordering the gate stack of the transistor; and
    spacers on the gate stacks of the transistors, said spacers comprising:

first spacers consisting of a first insulating material layer on the gate stacks of the LV MOS transistors of the first type;

second spacers consisting made of the first insulating material layer and a second insulating material layer different from the first insulating material layer on gate stacks of the HV MOS transistors of the first type;

third spacers consisting of the first insulating material layer, the second insulating material layer and a third insulating material layer made of a same material as the first insulating material layer on gate stacks of the HV MOS transistors of the second type; and fourth spacers consisting of the first insulating material layer and the third insulating material layer on gate stacks of the LV MOS transistors of the second type.

9. The device of claim 8, wherein the first and third insulating material layers join on the side of the semiconductor layer to form a U-shape with the second insulating material layer positioned between the first insulating material layer and the third insulating material layer.

10. The device of claim 8, wherein a gate insulator of the gate stack of the LV MOS transistors has an equivalent thickness smaller than an equivalent thickness of a gate insulator of the gate stack of the HV MOS transistors.

11. The device of claim 8, wherein the semiconductor layer rests on an insulator and a thickness of the semiconductor layer is smaller than 20 nm.

12. The device of claim 8, wherein the first insulating material layer is made of silicon nitride and the second insulating material layer is made of silicon oxide.

13. The device of claim 8, wherein the transistors of the first type are NMOS and wherein the transistors of the second type are PMOS.

14. The device of claim 8, wherein each of the first and second semiconductor material layers are made from materials selected from the group consisting of: silicon, germanium, silicon carbide, and silicon-germanium.

15. A method of manufacturing a device comprising a low-voltage (LV) metal oxide semiconductor (MOS) transistor and a high-voltage (HV) MOS transistor, comprising the successive steps of:

forming gate stacks of the LV and HV MOS transistors over a semiconductor layer;

depositing a first layer of a first insulating material;

depositing a second layer of a second insulating material;

forming first spacers made from the first layer of the first insulating material on sidewalls of the gate stack of the LV MOS transistor and on sidewalls of the gate stack of the HV MOS transistor;

forming second spacers made from the second layer of the second insulating material on sidewalls of the first spacers of the HV MOS transistor, but not on sidewalls of the first spacers of the LV MOS transistor;

depositing a third layer of a third insulating material;

forming third spacers made from the third layer of the third insulating material on sidewalls of the first spacers of the LV MOS transistor and on sidewalls of the second spacers of the HV MOS transistor; and epitaxially growing raised source and drain regions from the semiconductor layer for each of the LV and HV MOS transistors, said raised source and drain region separated from the gate stack of the LV MOS transistor by the third spacers, and said raised source and drain region separated from the gate stack of the HV MOS transistor by the fourth spacers.

16. The method of claim 15, wherein the first and third insulating materials are a same insulating material.

17. The method of claim 15, wherein forming first spacers on sidewalls of the gate stack of the LV MOS transistor comprises removing the second layer and forming the first layer into said first spacers.

18. The method of claim 15, wherein the LV and HV MOS transistors are p-channel transistors.

* * * * *

UNITED STATES PATENT AND TRADEMARK OFFICE
CERTIFICATE OF CORRECTION

PATENT NO. : 9,876,032 B2
APPLICATION NO. : 15/296205
DATED : January 23, 2018
INVENTOR(S) : Sonarith Chhun et al.

Page 1 of 1

It is certified that error appears in the above-identified patent and that said Letters Patent is hereby corrected as shown below:

In the Claims

At Column 7, Line number 4, please delete the word "made".

Signed and Sealed this
Twelfth Day of June, 2018

Andrei Iancu
*Director of the United States Patent and Trademark Office*